(12) United States Patent
Dai et al.

(10) Patent No.: US 9,912,186 B2
(45) Date of Patent: *Mar. 6, 2018

(54) MANAGEMENT OF HIGH-VOLTAGE LITHIUM-POLYMER BATTERIES IN PORTABLE ELECTRONIC DEVICES

(71) Applicant: Apple Inc., Cupertino, CA (US)

(72) Inventors: Hongli Dai, Los Altos, CA (US); Richard M. Mank, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/240,444

(22) Filed: Aug. 18, 2016

(65) Prior Publication Data

US 2016/0372943 A1 Dec. 22, 2016

Related U.S. Application Data

(63) Continuation of application No. 14/494,387, filed on Sep. 23, 2014, now Pat. No. 9,450,443, which is a continuation of application No. 13/217,592, filed on Aug. 25, 2011, now Pat. No. 8,854,012.

(51) Int. Cl.
| | |
|---|---|
| *H02J 7/00* | (2006.01) |
| *H02J 7/04* | (2006.01) |
| *H02J 7/16* | (2006.01) |
| *G01R 31/36* | (2006.01) |

(52) U.S. Cl.
CPC ........ *H02J 7/0091* (2013.01); *G01R 31/3606* (2013.01); *G01R 31/3679* (2013.01); *H02J 7/007* (2013.01); *H02J 7/0026* (2013.01); *H02J 7/041* (2013.01)

(58) Field of Classification Search
CPC ........ H02J 7/007; H02J 7/0073; H02J 7/0088; H02J 7/0091
USPC ......................... 320/153, 134, 150
See application file for complete search history.

(56) References Cited

U.S. PATENT DOCUMENTS

| | | | |
|---|---|---|---|
| 5,773,959 A | 6/1998 | Merritt | |
| 6,271,642 B1 * | 8/2001 | Dougherty | G08B 29/181 320/104 |
| 6,456,046 B1 * | 9/2002 | Gaza | H02J 7/0031 320/155 |
| 6,812,671 B2 | 11/2004 | Formenti | |
| 7,695,867 B2 | 4/2010 | Chang | |
| 8,169,195 B1 * | 5/2012 | Chait | H02J 7/0091 320/150 |
| 8,513,919 B2 * | 8/2013 | Bhardwaj | H02J 7/047 320/130 |
| 8,854,012 B2 * | 10/2014 | Dai | H02J 7/041 320/130 |

(Continued)

*Primary Examiner* — David V Henze-Gongola
(74) *Attorney, Agent, or Firm* — Blank Rome LLP (57) ABSTRACT

The disclosed embodiments provide a system that manages use of a battery corresponding to a high-voltage lithium-polymer battery in a portable electronic device. During operation, the system monitors a cycle number of the battery during use of the battery with the portable electronic device, wherein the cycle number corresponds to a number of charge-discharge cycles of the battery. If the cycle number exceeds one or more cycle number thresholds, the system modifies a charging technique for the battery to manage swelling in the battery and use of the battery with the portable electronic device.

20 Claims, 5 Drawing Sheets

(56) References Cited

U.S. PATENT DOCUMENTS

| | | | |
|---|---|---|---|
| 9,450,443 B2* | 9/2016 | Dai | H02J 7/041 |
| 2001/0001533 A1 | 5/2001 | StuckAndersen | |
| 2001/0031397 A1 | 10/2001 | Kweon | |
| 2005/0208380 A1 | 9/2005 | Park | |
| 2006/0024584 A1 | 2/2006 | Kim | |
| 2006/0226812 A1* | 10/2006 | Patino | H02J 7/0073 |
| | | | 320/128 |
| 2007/0139008 A1* | 6/2007 | Sterz | H02J 7/0068 |
| | | | 320/125 |
| 2009/0061325 A1 | 3/2009 | Odani | |
| 2009/0289603 A1* | 11/2009 | Mahowald | H02J 7/0057 |
| | | | 320/151 |
| 2011/0089907 A1 | 4/2011 | Bhardwaj | |
| 2011/0316548 A1 | 12/2011 | Ghantous | |
| 2012/0025771 A1 | 2/2012 | Bhardwaj | |
| 2013/0038275 A1 | 2/2013 | Chen | |

* cited by examiner

MANAGEMENT OF HIGH-VOLTAGE LITHIUM-POLYMER BATTERIES IN PORTABLE ELECTRONIC DEVICES

RELATED APPLICATION

The instant application is a continuation of pending U.S. patent application Ser. No. 14/494,387, which was filed on 23 Sep. 2014, which is a continuation of, and claims priority to, U.S. patent application Ser. No. 13/217,592, which was filed on 25 Aug. 2011, both of which are hereby incorporated by reference in their entireties.

BACKGROUND

Field

The present embodiments relate to batteries for portable electronic devices. More specifically, the present embodiments relate to techniques for managing the use of high-voltage lithium-polymer batteries with portable electronic devices.

Related Art

Portable electronic devices, such as laptop computers, portable media players, and/or mobile phones, typically operate using a rechargeable battery. Furthermore, designs for such batteries often include battery packs that contain battery cells connected together in various series and parallel configurations. For example, a six-cell battery pack of lithium-polymer cells may be configured in a three in series, two in parallel (3s2p) configuration. Hence, if a single cell can provide a maximum of 3 amps with a voltage ranging from 2.7 volts to 4.2 volts, then the entire battery pack can have a voltage range of 8.1 volts to 12.6 volts and provide 6 amps of current. The charge in such batteries is typically managed by a circuit, which is commonly known as a protection circuit module (PCM) and/or battery management unit (BMU).

During operation, the battery's capacity may diminish over time from an increase in internal impedance, electrode and/or electrolyte degradation, excessive heat, and/or abnormal use. For example, oxidation of electrolyte and/or degradation of cathode and anode material within a battery may be caused by repeated charge-discharge cycles and/or age, which in turn may cause a gradual reduction in the battery's capacity. As the battery continues to age and degrade, the capacity's rate of reduction may increase, particularly if the battery is continuously charged at a high charge voltage.

Continued use of a lithium-polymer battery over time may also produce swelling in the battery's cells and eventually cause the battery to exceed the designated maximum physical dimensions of the device. Moreover, conventional battery-monitoring mechanisms may not include functionality to manage swelling of the battery. As a result, a user of the device may not be aware of the battery's swelling and/or degradation until the swelling results in physical damage to the device.

Hence, what is needed is a mechanism for mitigating swelling and/or degradation in high-voltage lithium-polymer batteries for portable electronic devices.

SUMMARY

The disclosed embodiments provide a system that manages use of a battery corresponding to a high-voltage lithium-polymer battery in a portable electronic device. During operation, the system monitors a cycle number of the battery during use of the battery with the portable electronic device, wherein the cycle number corresponds to a number of charge-discharge cycles of the battery. If the cycle number exceeds one or more cycle number thresholds, the system modifies a charging technique for the battery to manage swelling in the battery and use of the battery with the portable electronic device.

In some embodiments, the system also monitors a temperature of the battery during use of the battery with the portable electronic device. If the temperature exceeds a temperature threshold, the system further modifies the charging technique for the battery. For example, the system may reduce a charge voltage of the battery by 10 mV to 50 mV if the temperature exceeds the temperature threshold.

In some embodiments, modifying the charging technique to manage swelling in the battery involves reducing the charge voltage of the battery if the cycle number exceeds a first cycle number threshold. The charge voltage may further be reduced if the cycle number exceeds a second cycle number threshold that is higher than the first cycle number threshold. For example, the charge voltage of the battery may initially be between 4.25V and 5.0V. The charge voltage may then be reduced by 10 mV to 50 mV each time the cycle number exceeds a cycle number threshold.

In some embodiments, the system also monitors a state-of-charge of the battery during charging of the battery and further modifies the charging technique based on the monitored state-of-charge. For example, the system may disconnect the battery from a charger if the battery remains in a fully charged state for longer than a time threshold (e.g., 24 hours).

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a battery management unit (BMU), a battery protection circuit module (PCM), a dedicated or shared processor that executes a particular software module or a piece of code at a particular time, and/or other programmable-logic devices now known or later developed. When the hardware modules or apparatus are activated, they perform the methods and processes included within them.

Embodiments provide a method and system for monitoring a battery in a portable electronic device. The battery may include one or more cells in a parallel and/or series configuration and supply power to a mobile phone, laptop computer, portable media player, and/or peripheral device. For example, the battery may correspond to a lithium-polymer battery that includes one or more cells, each of which includes a jelly roll of layers wound together (e.g., a cathode with an active coating, a separator, and an anode with an active coating), and a flexible pouch enclosing the jelly roll. In addition, the battery may be reused up to a number of charge cycles before losing enough capacity to reach an end-of-life. The battery may also swell as capacity diminishes over time.

More specifically, embodiments provide a method and system for managing swelling in a high-voltage lithium-polymer battery, as well as use of the battery with a portable electronic device. The high-voltage lithium-polymer battery may be associated with a maximum charge voltage of between 4.25V and 5.0 V. To manage swelling in the battery and/or extend use of the battery with the portable electronic device, the temperature of the battery and/or a cycle number corresponding to a number of charge-discharge cycles of the battery may be monitored. If the temperature exceeds a temperature threshold and/or the cycle number exceeds one or more cycle number thresholds, a charging technique for the battery may be modified to manage swelling in the battery and/or mitigate degradation in the battery. For example, the charge voltage of the battery may be between 4.25V and 5.0V (e.g., the maximum charge voltage) during initial use of the battery with the portable electronic device. The charge voltage may then be reduced by 10 mV to 50 mV each time the cycle number exceeds a cycle number threshold (e.g., every 300 charge-discharge cycles) and/or the temperature exceeds a temperature threshold (e.g., 45° Celsius).

In addition, the state-of-charge of the battery may be monitored during charging of the battery to detect a fully charged state of the battery. If the battery remains in a fully charged state for longer than a time threshold (e.g., 24 hours), the charging technique may be modified to disconnect the battery from a charger. Such management of the battery based on the battery's temperature, cycle number, and/or state-of-charge may reduce both swelling and degradation in the battery, thus extending use of the battery with the portable electronic device and mitigating damage to the portable electronic device.

Figure 1:
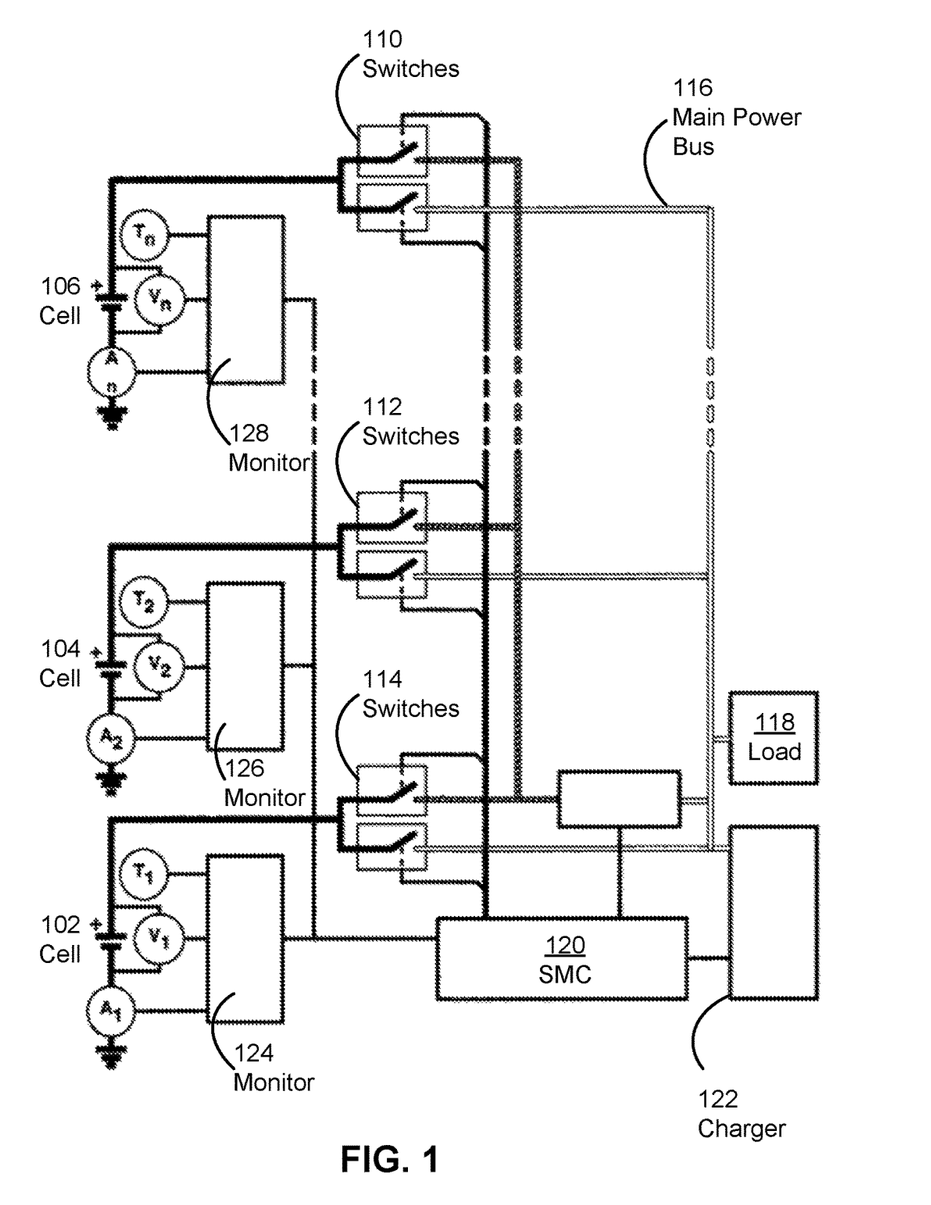
FIG. 1 shows a schematic of a system in accordance with an embodiment.

FIG. 1 shows a schematic of a system in accordance with an embodiment. The system may provide a power source to a portable electronic device, such as a mobile phone, personal digital assistant (PDA), laptop computer, tablet computer, portable media player, and/or peripheral device. In other words, the system may correspond to a battery that supplies power to a load 118 from one or more components (e.g., processors, peripheral devices, backlights, etc.) within the portable electronic device. For example, the battery may correspond to a lithium-polymer battery that includes one or more cells, each of which includes a jelly roll of layers wound together (e.g., a cathode with an active coating, a separator, and an anode with an active coating), and a flexible pouch enclosing the jelly roll. As shown in FIG. 1, the system includes a number of cells 102-106, a set of switches 110-114, a main power bus 116, a system microcontroller (SMC) 120, a charger 122, and a set of monitors 124-128.

In one or more embodiments, cells 102-106 are connected in a series and/or parallel configuration with one another using main power bus 116. Each cell 102-106 may include a sense resistor (not shown) that measures the cell's current. Furthermore, the voltage and temperature of each cell 102-106 may be measured with a thermistor (not shown), which may further allow a battery "gas gauge" mechanism to determine the cell's state-of-charge, impedance, capacity, charging voltage, and/or remaining charge. Measurements of voltage, current, temperature, and/or other parameters associated with each cell 102-106 may be collected by a corresponding monitor 124-128. Alternatively, one monitoring apparatus may be used to collect sensor data from multiple cells 102-106 in the battery.

Data collected by monitors 124-128 may then be used by SMC 120 to assess the state-of-charge, capacity, and/or health of cells 102-106. Monitors 124-128 and SMC 120 may be implemented by one or more components (e.g., processors, circuits, etc.) of the portable electronic device.

In particular, SMC 120 may use the data to manage use of the battery in the portable electronic device. For example, SMC 120 may correspond to a management apparatus that uses the state-of-charge of each cell 102-106 to adjust the charging and/or discharging of the cell by connecting or disconnecting the cell to main power bus 116 and charger 122 using a set of switches 110-114. Fully discharged cells may be disconnected from main power bus 116 during discharging of the battery to enable cells with additional charge to continue to supply power to load 118. Along the same lines, fully charged cells may be disconnected from main power bus 116 during charging of the battery to allow other cells to continue charging.

Those skilled in the art will appreciate that reductions in battery capacity may result from factors such as age, use, defects, heat, and/or damage. Furthermore, a decrease in battery capacity beyond a certain threshold (e.g., below 80% of initial capacity) may be accompanied by swelling of the battery that damages or distorts the portable electronic device.

In particular, charging and discharging of the battery may cause a reaction of electrolyte with cathode and anode material. The reaction may both decrease the capacity of the battery and cause swelling through enlargement of the electrode and/or gas buildup inside the battery. Moreover, the reaction may be accelerated if the battery is operated at higher temperatures and/or continuously charged at high charge voltages. For example, a lithium-polymer battery that is operated at 25° Celsius and/or charged at 4.2V may reach 80% of initial capacity and increase in thickness by 8% after 1050 charge-discharge cycles. However, use of the same battery at 45° Celsius and/or a charge voltage of 4.3V may decrease the capacity to 70% of initial capacity and increase the swelling to 10% after 1050 charge-discharge cycles.

In one or more embodiments, the battery of FIG. 1 corresponds to a high-voltage lithium-polymer battery with a maximum charge voltage of 4.25V to 5.0V. To reduce the reaction of electrolyte with electrode material in the battery, electrode material in cells 102-106 may be coated with a passivating layer, and electrolyte in cells 102-106 may contain anti-oxidation additives. Consequently, the composition of cells 102-106 may allow the battery to be charged at a higher-than-normal charge voltage for a lithium-polymer battery without accelerating the rate of swelling and/or degradation in the battery.

The system of FIG. 1 may also include functionality to modify the charging technique for the battery in a way that mitigates swelling in the battery and/or extends the battery's end-of-life. During use of the battery with the portable electronic device, monitors 124-128 and/or SMC 120 may monitor a cycle number (e.g., the number of charge-discharge cycles of the battery), temperature, and/or state-of-charge of the battery. For example, SMC 120 may monitor the cycle number by tracking the charging and/or discharging of cells 102-106 and obtain temperature and voltage measurements of cells 102-106 from monitors 124-128. SMC 120 may then calculate the state-of-charge from the temperature and/or voltage measurements, or SMC 120 may obtain the state-of-charge from a "gas gauge" mechanism associated with the battery.

Next, SMC 120 may modify a charging technique for the battery to manage swelling in the battery if the cycle number exceeds one or more cycle number thresholds, the temperature exceeds one or more temperature thresholds, and/or the battery remains in a fully charged state for longer than a time threshold. First, SMC 120 may reduce a charge voltage of the battery each time a cycle number and/or temperature threshold is exceeded. For example, if the temperature of the battery is below 45° Celsius, SMC 120 may reduce the charge voltage from 4.3V to 4.28V after the battery exceeds 300 charge-discharge cycles, and then from 4.28V to 4.26V after the battery exceeds 600 charge-discharge cycles. On the other hand, if the temperature of the battery exceeds 45° Celsius, SMC 120 may charge the battery at 4.28V until the battery reaches 300 charge-discharge cycles. Once the battery's cycle number exceeds 300, SMC 120 may lower the charge voltage to 4.26V. Finally, SMC 120 may lower the charge voltage to 4.25V after the battery exceeds 600 charge-discharge cycles.

Similarly, if the state-of-charge of the battery is less than 100%, SMC 120 may maintain the charge voltage of the battery as determined based on the cycle number and/or temperature of the battery. Once the state-of-charge reaches a fully charged state (e.g., 100%) and stays at the fully charged state for longer than a time threshold, SMC 120 may disconnect the battery from charger 122. SMC 120 may then reconnect the battery to charger 122 if the state-of-charge drops below 95%.

Such modifications to the charging technique may mitigate swelling-induced damage to the portable electronic device and/or degradation in the battery by both reducing swelling in the battery and extending the end-of-life of the battery. More specifically, a reduced charge voltage may cause the battery to charge at a slower rate and/or stop charging before a fully charged state is reached, thus reducing gas buildup that causes the battery to swell and/or lowers the battery's capacity. Additional mitigation of swelling and/or capacity reduction may be provided by disconnecting the battery from charger 122 once the battery remains at a fully charged state for longer than a pre-specified time threshold, which slows the repeated "top-off" of the battery that may occur if the battery is continuously connected to charger 122 for long periods of time.

Those skilled in the art will appreciate that the system of FIG. 1 may be implemented in a variety of ways. For example, SMC 120 and monitors 124-128 may be implemented using one or more hardware modules (e.g., integrated circuits) in the portable electronic device. On the other hand, a portion of the functionality of SMC 120 and/or monitors 124-128 may be implemented in software that executes on a processor of the portable electronic device. In other words, the monitoring and management of cells 102-106 in the battery may be conducted by different combinations of hardware and/or software components on the portable electronic device. Furthermore, the number of cells 102-106 in the battery may be based on the portable electronic device powered by the battery. For example, a battery for a mobile phone may include only one high-voltage lithium-polymer cell, while a battery for a tablet computer or a laptop computer may contain multiple high-voltage lithium-polymer cells.

Figure 2:
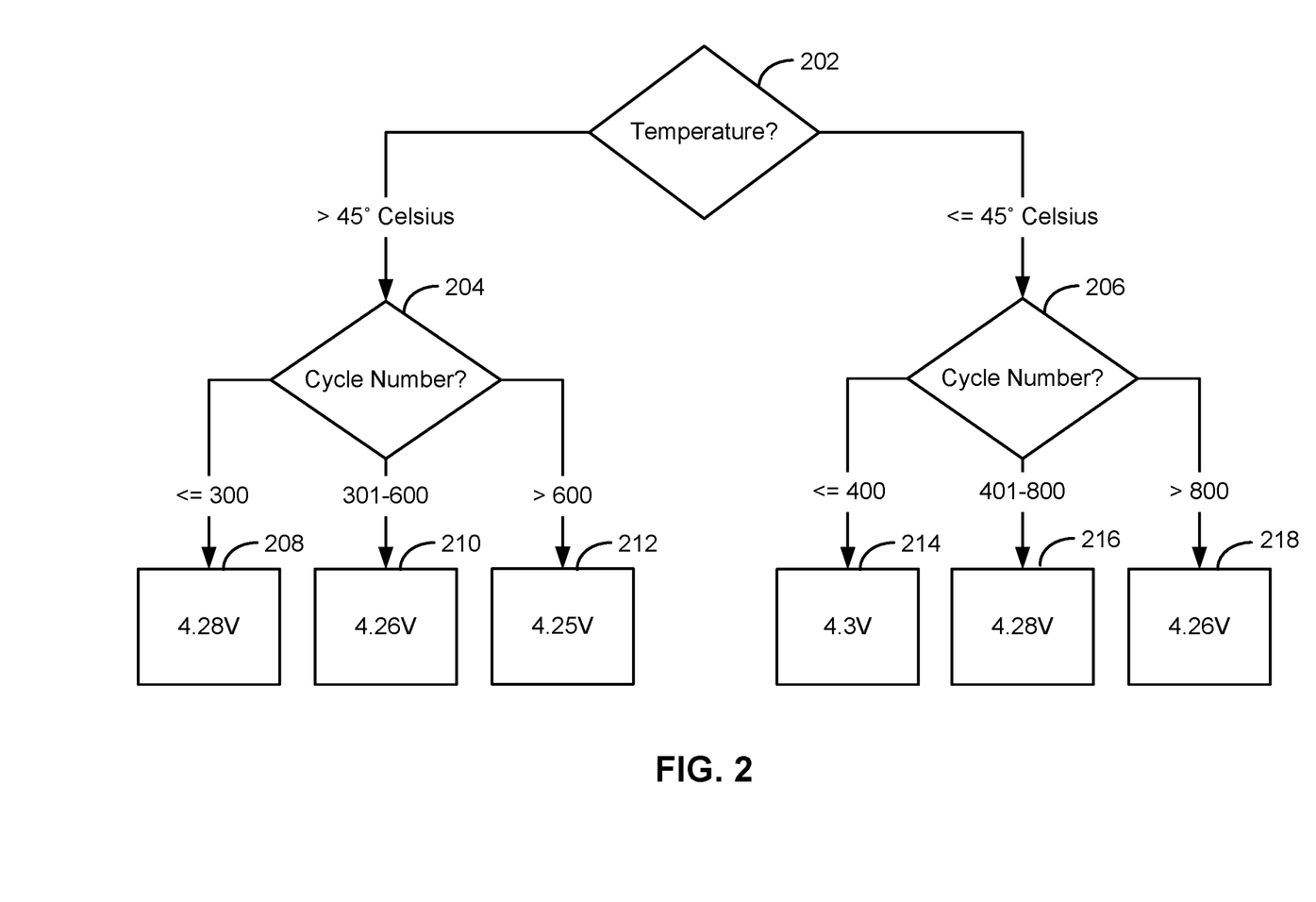
FIG. 2 shows an exemplary charging technique for a high-voltage lithium-polymer battery in accordance with an embodiment.

FIG. 2 shows an exemplary charging technique for a high-voltage lithium-polymer battery in accordance with an embodiment. More specifically, FIG. 2 shows a charging technique that modifies a charge voltage of the battery based on a temperature 202 and/or a cycle number 204-206 of the battery. Temperature 202 and cycle number 204-206 may be monitored during use of the battery with a portable electronic device. For example, temperature readings may be collected by one or more thermistors in the battery, and the battery's cycle number may be monitored by tracking the number of charge-discharge cycles in the battery.

As discussed above, a higher temperature may accelerate swelling and/or degradation in the battery. Consequently, a temperature threshold of 45° Celsius may trigger a number of reductions in the charge voltage of the battery to offset the effects of temperature on the swelling and/or degradation. If temperature 202 is above the temperature threshold, the battery's charge voltage is based on two cycle number thresholds of 300 and 600. If the battery's cycle number 204 is at or below the first cycle number threshold of 300, the battery is charged at a charge voltage 208 of 4.28V. If cycle number 204 is above the first cycle number threshold and at or below a second cycle number threshold of 600, the battery is charged at a charge voltage 210 of 4.26V. If cycle number 204 is above the second cycle number threshold, the battery is charged at a charge voltage 212 of 4.25V.

If temperature 202 is at or below the temperature threshold of 45° Celsius, the battery's charge voltage is based on two cycle number thresholds of 400 and 800. If the battery's cycle number 206 is at or below the first cycle number threshold of 400, the battery is charged at a charge voltage 214 of 4.3V. If cycle number 206 is above the first cycle number threshold and at or below a second cycle number threshold of 800, the battery is charged at a charge voltage 216 of 4.28V. If cycle number 206 is above the second cycle number threshold, the battery is charged at a charge voltage 218 of 4.26V. As a result, the battery may be charged at higher charge voltages for longer periods of time if the battery is operated at or below 45° Celsius than if the battery were operated at above 45° Celsius.

Figure 3:
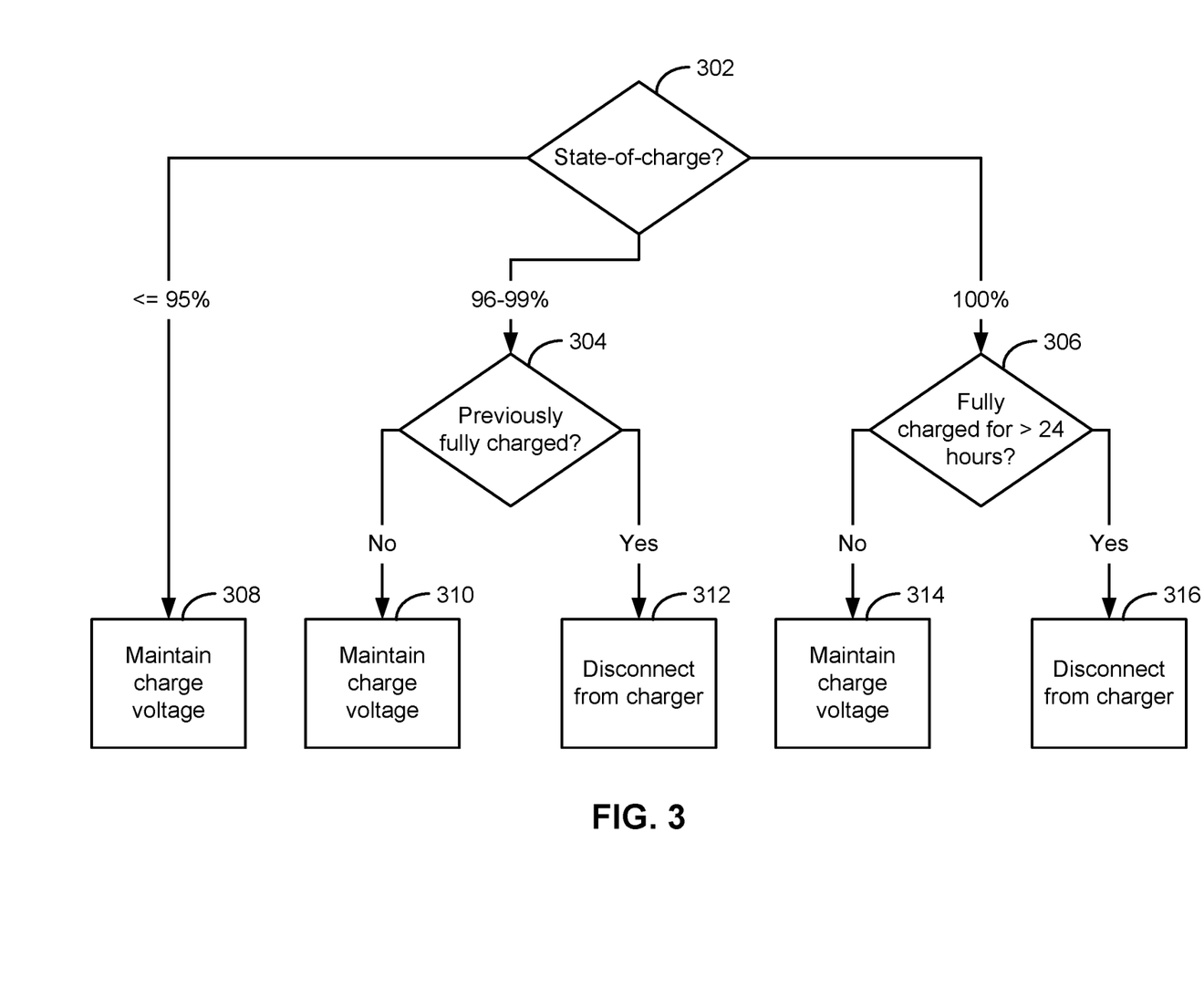
FIG. 3 shows an exemplary charging technique for a high-voltage lithium-polymer battery in accordance with an embodiment.

FIG. 3 shows an exemplary charging technique for a high-voltage lithium-polymer battery in accordance with an embodiment. The charging technique of FIG. 3 may modify the charge voltage and/or charging of the battery based on a state-of-charge 302 and/or previously fully charged state 304 of the battery. State-of-charge 302 may be calculated by a "gas gauge" mechanism associated with the battery. For example, the "gas gauge" mechanism may calculate state-of-charge 302 based on battery voltage and/or temperature measurements from a monitoring apparatus (e.g., monitors 124-128 of FIG. 1) associated with the battery.

As shown in FIG. 3, if state-of-charge 302 is less than or equal to 95%, the charge voltage of the battery is maintained 308. As discussed above, the charge voltage may be based on the cycle number and/or temperature of the battery. For example, a charge voltage of 4.3V may be applied to a relatively new and/or cool battery until state-of-charge reaches 95%.

If state-of-charge 302 exceeds 95%, the battery may continue to be charged and/or disconnected from the charger based on a previously fully charged state 304 of the battery. If the battery has just exceeded a 95% state-of-charge 302, the battery is not associated with a previously fully charged state 304, and the charge voltage is maintained 310.

Conversely, if the battery has reached a 100% state-of-charge 302 and remains fully charged for more than 24 hours 306, the battery is disconnected from the charger 316. Such disconnection 312 may be maintained as the battery self-discharges in the 96-99% state-of-charge 302 range because the battery is associated with the previously fully charged state 304. Once state-of-charge 302 drops below 96%, the battery is no longer considered previously fully charged 304, and charging of the battery resumes at the charge voltage of the battery 308-310. Such disconnection from the charger after the battery remains in a fully charged state for longer than a pre-specified time threshold of 24 hours may reduce the amount of "top off" that may occur during connection of the battery to the charger for long periods of time (e.g., overnight).

Figure 4:
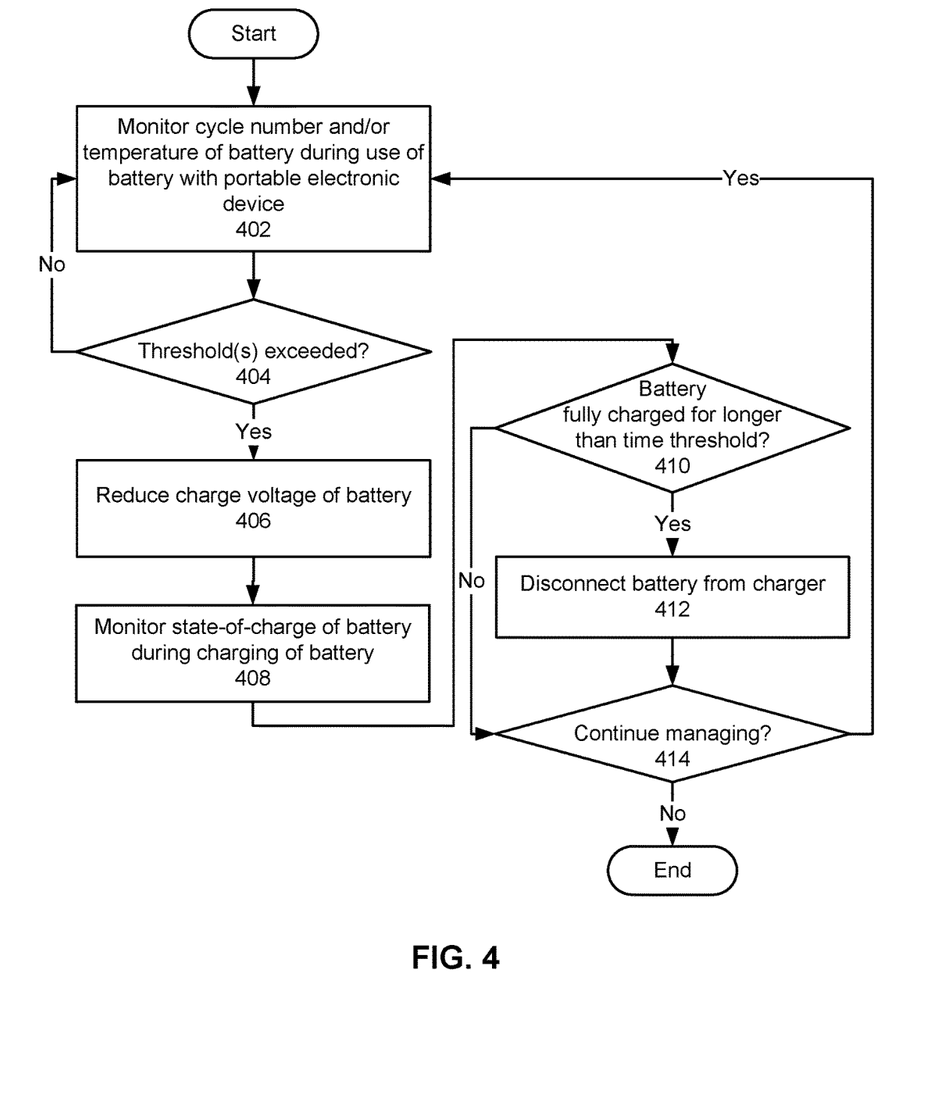
FIG. 4 shows a flowchart illustrating the process of managing use of a battery corresponding to a high-voltage lithium-polymer battery in a portable electronic device in accordance with an embodiment.

FIG. 4 shows a flowchart illustrating the process of managing use of a battery corresponding to a high-voltage lithium-polymer battery in a portable electronic device in accordance with an embodiment. In one or more embodiments, one or more of the steps may be omitted, repeated, and/or performed in a different order. Accordingly, the specific arrangement of steps shown in FIG. 4 should not be construed as limiting the scope of the embodiments.

First, a cycle number and/or temperature of the battery are monitored during use of the battery with the portable electronic device (operation 402). The cycle number may correspond to a number of charge-discharge cycles of the battery. The cycle number and/or temperature may also exceed one or more thresholds (operation 404). For example, the cycle number may exceed one or more cycle number thresholds as the battery is used over time, and the temperature may exceed one or more temperature thresholds if the battery is insufficiently cooled. If no thresholds are exceeded, the battery may continue to be monitored (operation 402).

If one or more thresholds are exceeded, a charging technique for the battery is modified (operation 406) to manage swelling in the battery and use of the battery with the portable electronic device. The charging technique may be modified by reducing the charge voltage of the battery. For example, the charge voltage may be reduced by 10 mV to 50 mV every 300 charge-discharge cycles and/or if the temperature exceeds 45° Celsius.

The state-of-charge of the battery may also be monitored during charging of the battery (operation 408) to detect if the battery remains in a fully charged state for longer than a time threshold (operation 410). If the battery exceeds the time threshold in the fully charged state, the battery is disconnected from a charger (operation 412). For example, the battery may be disconnected from the charger if the battery is at a 99% to 100% state-of-charge for longer than 24 hours. If the state-of-charge does not correspond to a fully charged state, the battery may continue to be charged based on the cycle number and/or temperature of the battery.

Management of the battery may continue (operation 414). For example, the battery may be managed during use of the battery to power components in the portable electronic device. If management of the battery is to continue, the cycle number and temperature of the battery are monitored (operation 402) and compared with one or more thresholds (operation 404) during use of the battery with the portable electronic device, and the charging technique may be modified (operation 406) as cycle number and/or temperature thresholds are exceeded. At the same time, the state-of-charge of the battery may be monitored during charging of the battery (operation 408) and used to determine a fully charged state of the battery (operation 410) and/or further modify the charging technique based on the fully charged state (operation 412). Monitoring and use of the battery may thus continue until the battery is replaced and/or the battery is no longer used to power the portable electronic device.

Figure 5:
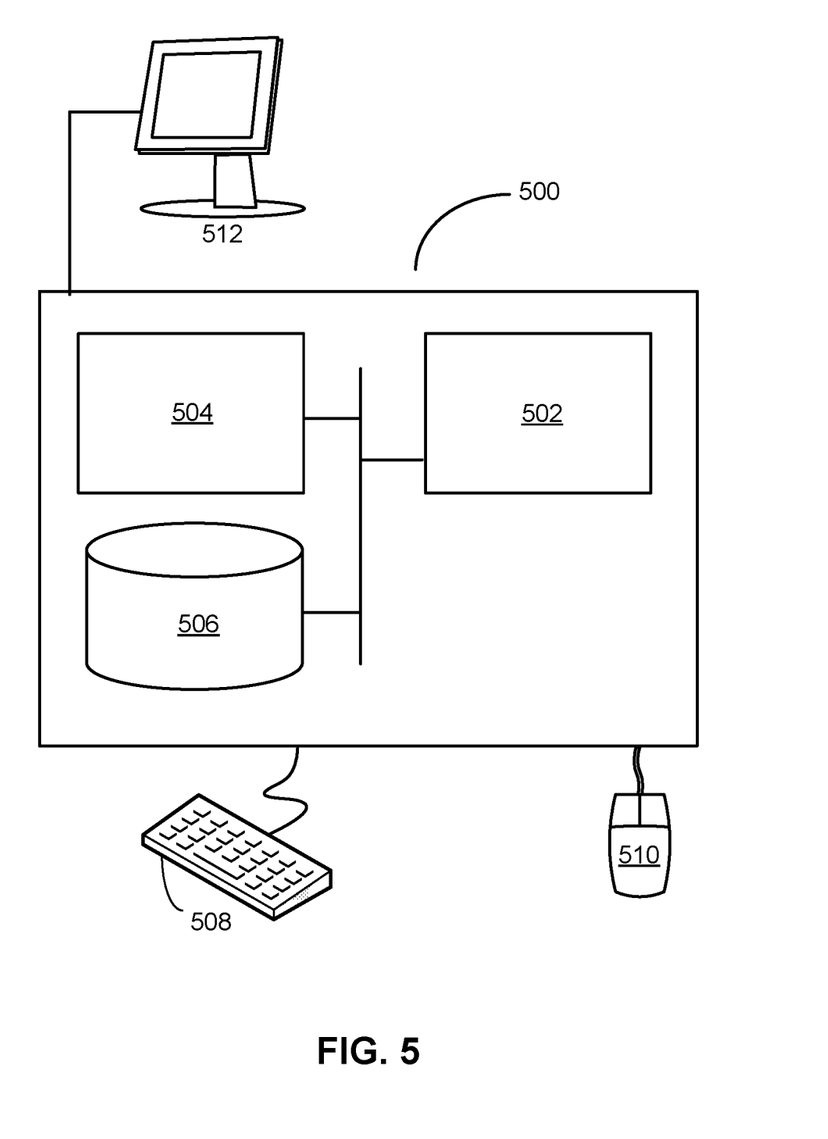
FIG. 5 shows a computer system in accordance with an embodiment.

FIG. 5 shows a computer system 500 in accordance with an embodiment. Computer system 500 includes a processor 502, memory 504, storage 506, and/or other components found in electronic computing devices. Processor 502 may support parallel processing and/or multi-threaded operation with other processors in computer system 500. Computer system 500 may also include input/output (I/O) devices such as a keyboard 508, a mouse 510, and a display 512.

Computer system 500 may include functionality to execute various components of the present embodiments. In particular, computer system 500 may include an operating system (not shown) that coordinates the use of hardware and software resources on computer system 500, as well as one or more applications that perform specialized tasks for the user. To perform tasks for the user, applications may obtain the use of hardware resources on computer system 500 from the operating system, as well as interact with the user through a hardware and/or software framework provided by the operating system.

In one or more embodiments, computer system 500 provides a system for managing use of a battery corresponding to a high-voltage lithium-polymer battery in a portable electronic device. The system may include a monitoring apparatus that monitors a cycle number of the battery during use of the battery with the portable electronic device. The system may also include a management apparatus that modifies a charging technique for the battery to manage swelling in the battery if the cycle number exceeds one or more cycle number thresholds. The monitoring apparatus may additionally monitor a temperature of the battery during use of the battery with the portable electronic device, and the management apparatus may further modify the charging technique if the temperature exceeds one or more temperature thresholds. Finally, the monitoring apparatus may monitor a state-of-charge of the battery during charging of the battery and further modify the charging technique based on the monitored state-of-charge. For example, the monitoring apparatus may disconnect the battery from a charger if the battery remains at a fully charged state for longer than a time threshold.

In addition, one or more components of computer system 500 may be remotely located and connected to the other components over a network. Portions of the present embodiments (e.g., monitoring apparatus, management apparatus, etc.) may also be located on different nodes of a distributed system that implements the embodiments. For example, the present embodiments may be implemented using a cloud computing system that monitors and manages batteries in remote portable electronic devices.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An electronic system, the electronic system comprising:
   at least one battery cell, the battery cell having a charge voltage;
   at least one controller coupled to the battery cell, the controller configured to:
      monitor a cycle number of the battery cell, the cycle number corresponding to a number of charge-discharge cycles of the battery cell;
      monitor a temperature of the battery cell;
      monitor a state-of-charge of the battery cell;
      reduce the charge voltage applied to the battery cell when the temperature of the battery cell exceeds a temperature threshold and the cycle number exceeds a first cycle number threshold;
      reduce the charge voltage applied to the battery cell when the temperature of the battery cell does not exceed the temperature threshold and the cycle number exceeds a second cycle number threshold different from the first cycle number threshold; and
      cause charging of the battery cell to cease when the state-of-charge of the battery cell is a fully charged state for a time period exceeding a time threshold.

2. The electronic system of claim 1, wherein the temperature threshold is 45 degrees Celsius.

3. The electronic system of claim 1, wherein the controller is further configured to cause resumption of charging when the state-of-charge of the battery cell is less than or equal to 95 percent of the fully charged state.

4. The electronic system of claim 1, wherein the controller is a microcontroller.

5. The electronic system of claim 1, wherein the time threshold is 24 hours.

6. The electronic system of claim 1, wherein the first cycle number threshold is 300 charge-discharge cycles or 600 charge-discharge cycles.

7. The electronic system of claim 1, wherein the charge voltage is reduced by an increment after a predetermined number of charge-discharge cycles or every time the battery cell exceeds the temperature threshold.

8. The electronic system of claim 7, wherein the increment is between 10 mV and 50 mV, the predetermined number of charge-discharge cycles is 300, and the temperature threshold is 45° C.

9. A non-transitory computer readable storage medium storing instructions executable by a controller, the instructions comprising instructions to cause the controller to:
   monitor a cycle number of a battery cell, the cycle number corresponding to a number of charge-discharge cycles of the battery cell, the battery cell having a charge voltage;
   monitor a temperature of the battery cell;
   monitor a state-of-charge of the battery cell;
   reduce the charge voltage applied to the battery cell when the temperature of the battery cell exceeds a temperature threshold and the cycle number exceeds a first cycle number threshold;
   reduce the charge voltage applied to the battery cell when the temperature of the battery cell does not exceed the temperature threshold and the cycle number exceeds a second cycle number threshold different from the first cycle number threshold; and
   cause charging of the battery cell to cease when the state-of-charge of the battery cell is a fully charged state for a time period exceeding a time threshold.

10. The non-transitory computer readable storage medium of claim 9, wherein the temperature threshold is 45 degrees Celsius.

11. The non-transitory computer readable storage medium of claim 9, wherein the instructions further comprise instructions to cause the controller to cause resumption of charging when the state-of-charge of the battery cell is less than or equal to 95 percent of the fully charged state.

12. The non-transitory computer readable storage medium of claim 9, wherein the time threshold is 24 hours.

13. The non-transitory computer readable storage medium of claim 9, wherein the first cycle number threshold is 300 charge-discharge cycles or 600 charge-discharge cycles.

14. The non-transitory computer readable storage medium of claim 9, wherein the instructions to reduce the charge voltage of the battery cell reduce the charge voltage by an increment after a predetermined number of charge-discharge cycles or every time the battery cell exceeds the temperature threshold.

15. The non-transitory computer readable storage medium of claim 14, wherein the increment is between 10 mV and 50 mV, the predetermined number of charge-discharge cycles is 300, and the temperature threshold is 45° C.

16. A method of monitoring a battery cell, the method comprising:
   monitoring, by at least one monitor, a cycle number of at least one battery cell, the cycle number corresponding to a number of charge-discharge cycles of the at least one battery cell, the at least one battery cell having a charge voltage;
   monitoring, by the monitor, a temperature of the at least one battery cell;
   monitoring, by the monitor, a state-of-charge of the at least one battery cell;
   reducing the charge voltage applied to the battery cell when the temperature of the at least one battery cell exceeds a temperature threshold and the cycle number exceeds a first cycle number threshold;
   reducing the charge voltage applied to the at least one battery cell when the temperature of the at least one battery cell does not exceed the temperature threshold and the cycle number exceeds a second cycle number threshold different from the first cycle number threshold; and
   causing, under control of the controller, the charging of the at least one battery cell to cease when the state-of-charge of the at least one battery cell is a fully charged state for a time period exceeding a time threshold.

17. The method of claim 16, wherein the temperature threshold is 45 degrees Celsius.

18. The method of claim 16, wherein the time threshold is 24 hours.

19. The method of claim 16, wherein the first cycle number threshold is 300 charge-discharge cycles or 600 charge-discharge cycles.

20. The method of claim 16, wherein reducing the charge voltage applied to the at least one battery cell comprises reducing the charge voltage by an increment after a predetermined number of charge-discharge cycles or every time the battery cell exceeds the temperature threshold, wherein the increment is between 10 mV and 50 mV, the predetermined number of charge-discharge cycles is 300, and the temperature threshold is 45° C.

\* \* \* \* \*